United States Patent
Panigada et al.

(10) Patent No.: US 8,643,522 B2
(45) Date of Patent: Feb. 4, 2014

(54) MULTICHANNEL ANALOG TO DIGITAL CONVERTER APPARATUS AND METHOD FOR USING

(75) Inventors: Andrea Panigada, San Diego, CA (US); Jorge Grilo, San Diego, CA (US); Daniel Meacham, Del Mar, CA (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 13/489,714

(22) Filed: Jun. 6, 2012

(65) Prior Publication Data

US 2013/0002460 A1     Jan. 3, 2013

Related U.S. Application Data

(60) Provisional application No. 61/494,386, filed on Jun. 7, 2011.

(51) Int. Cl.
*H03M 1/00*    (2006.01)
(52) U.S. Cl.
USPC ............ 341/141; 341/122; 341/142; 341/155
(58) Field of Classification Search
USPC .......................... 341/118, 120, 142, 155, 141
See application file for complete search history.

(56) References Cited

U.S. PATENT DOCUMENTS

| | | | | |
|---|---|---|---|---|
| 6,486,809 B1* | 11/2002 | Figoli | | 341/141 |
| 6,809,674 B1* | 10/2004 | Ramsden | | 341/155 |
| 7,049,993 B2* | 5/2006 | Ando | | 341/155 |
| 7,400,283 B1* | 7/2008 | Zhu | | 341/141 |
| 7,626,524 B2* | 12/2009 | Horie | | 341/141 |
| 7,656,329 B2* | 2/2010 | Wu | | 341/141 |
| 7,796,069 B2* | 9/2010 | Li | | 341/122 |
| 7,944,384 B2* | 5/2011 | Fredriksen | | 341/141 |
| 2005/0140532 A1* | 6/2005 | Rubin et al. | | 341/141 |
| 2007/0035425 A1* | 2/2007 | Hinrichs et al. | | 341/143 |
| 2008/0167558 A1* | 7/2008 | Song et al. | | 600/447 |
| 2008/0191913 A1 | 8/2008 | Komatsu et al. | | 341/122 |
| 2009/0238460 A1* | 9/2009 | Funayama et al. | | 382/181 |
| 2010/0134336 A1* | 6/2010 | Sung et al. | | 341/144 |
| 2010/0245141 A1* | 9/2010 | Ushie | | 341/122 |
| 2010/0328122 A1* | 12/2010 | Li | | 341/122 |
| 2011/0075768 A1* | 3/2011 | Zhan et al. | | 375/340 |

OTHER PUBLICATIONS

Anonymous, "Upsampling", Wikipedia, the Free Encylopedia, http://en.wikipedia,org/w/index.php?title=upsampling&oldid=404555323; 2 pages, Dec. 28, 2010.

Johansson, H., et al., "Adjustable Fractional-Delay FIR Filters using the Farrow Structure and Multirate Technique", pp. 1055-1058, Dec. 1, 2006.

(Continued)

*Primary Examiner* — Linh Nguyen
(74) *Attorney, Agent, or Firm* — King & Spalding L.L.P.

(57) ABSTRACT

A system including a sample-and-hold circuit for receiving a plurality of analog input signals; an analog-to-digital converter for converting each of the analog inputs to a digital signal; and a processor configured for implementing fractional delay recovery for the analog-to-digital converter. In some embodiments, the fractional delay recovery includes converting each of the plurality of analog input signals to a digital version in the predetermined order; upsampling each digital version in the predetermined order; digitally filtering each upsampled value in the predetermined order; and downsampling each filtered value in the predetermined order.

12 Claims, 4 Drawing Sheets

(56) References Cited

OTHER PUBLICATIONS

Luengo, D., et al., "A Novel Simultaneous Sampling Technique and its Application to Multipoint Optical Fibre Sensor Accelerometers", International Conf. on Signal Processing Applications & Technology, 5 pages, Sep. 1, 1998.

Luengo-Garcia, et al,, "Simultaneous Sampling by Digital Phase Correction", IEEE Instrumentation and Measurement, Technology Conference; pp. 980-984, May 19, 1997.

International PCT Search Report and Written Opinion, PCT/US2012/041264, 15 pages, Sep. 21, 2012.

* cited by examiner

MULTICHANNEL ANALOG TO DIGITAL CONVERTER APPARATUS AND METHOD FOR USING

CROSS-REFERENCE TO RELATED APPLICATIONS

This invention claims priority from U.S. Provisional Patent Application Ser. No. 61/494,386 filed Jun. 7, 2011, titled "MULTICHANNEL ANALOG TO DIGITAL CONVERTER APPARATUS AND METHOD FOR USING," which is hereby incorporated by reference in its entirety as if fully set forth herein.

BACKGROUND OF THE INVENTION

1. Field of the Invention

The present invention relates generally to analog to digital converters, and more specifically to multichannel converters.

2. Description of the Related Art

Many electronic systems, for example communication, instrumentation, and medical equipment, embed multiple data channels in a single device such that many signals can be received, processed and transmitted in parallel and at the same time.

For example, some radio systems using a technology called multiple-input and multiple-output (MIMO), use multiple antennas at both the transmitter and receiver to improve communication performance. The signal processing between receiving antennas and transmitting antennas is performed in parallel on multiple signals.

In another example, an ultrasound system for medical applications collects signals from the human body from as many as 512 sensors, and then it processes and combines the information received by such sensors to enhance the image of tissues and organs.

A key block in such systems is an Analog-to-Digital Converter (ADC). The purpose of an ADC is to provide a digital version of an analog signal. In a typical multiple channel receiver, each analog signal is converted into digital format by an ADC.

For example, looking to FIG. 1, a four channel receiver has four ADCs $102n$. This arrangement has several limitations. For example:

A mismatch between physically different ADCs 102 due to fabrication variations may affect the accuracy of post processing in a Digital Signal Processing ("DSP") block.

Balanced clock distribution 106 among different ADCs $102n$ can be difficult. Any clock skew may lead to random offsets between channels in the sampling instants of the different channels. In systems where synchronous sampling is required, clock path mismatch may limit performance.

The power consumption of an n-channel system is often at least n times the power consumption of a single ADC.

If a number n ADCs $102n$ are integrated in the same silicon, and the test yield of a single ADC is less than 100%, the yield of the system will be reduced to pn.

The front-end circuit of an ADC often comprises a block denominated a sample-and-hold (S&H) circuit. The function of an S&H is to sample an analog signal in discrete-time analog quantities. The remainder of the ADC quantizes such discrete time analog samples into discrete levels. A digital code, for example binary, thermometer, or the like, is then associated with each quantized level.

FIG. 2 is an example of a typical sample-and-hold function. The analog input 202 is connected to a capacitor 204 via a switch 208 which may be turned ON (closed) or OFF (open) in response to a sampling clock 206. When the switch 208 is ON, the analog input 202 will charge the capacitor 204 (or, said differently, the capacitor samples the input), but as soon as the switch 208 is turned OFF, the capacitor 204 is disconnected from the input, thereby holding the charge that was provided by the input 202. An ADC may at a later time be electrically connected to an output terminal 210 and convert the held charge to a digital value.

FIG. 3 illustrates an exemplary prior art alternative to multiple ADCs. As shown, a single ADC 302 is clocked by sample clock 305 and switches 304 between analog inputs 308 responsive to the sample clock 305. The resulting digital output is 1-2-3-4-1-2-3-4-1-2 . . . and is provided to DSP 304.

However, such systems are only usable for low bandwidth systems wherein clock skew and other issues are not significant at their low conversion rates. What is needed is an ADC system employing a single ADC while minimizing the above-listed problems.

SUMMARY OF THE INVENTION

These and other drawbacks in the prior art are overcome in large part by a system and method according to embodiments of the present invention. A system, in accordance with embodiments as claimed includes a sample-and-hold circuit for receiving a plurality of analog input signals; an analog-to-digital converter for converting each of the analog inputs to a digital signal; and a processor configured for implementing fractional delay recovery for the analog-to-digital converter. In some embodiments, the fractional delay recovery includes converting each of the plurality of analog input signals to a digital version in the predetermined order; upsampling each digital version in the predetermined order; digitally filtering each upsampled value in the predetermined order; and downsampling each filtered value in the predetermined order.

A computer-implemented method for controlling a multichannel analog to digital converter, wherein the analog to digital converter includes a sample and hold circuit, according to embodiments includes sampling a plurality of analog signals in a predetermined order; converting each analog signal to a digital version in the predetermined order; upsampling each digital version in the predetermined order; digitally filtering each upsampled value in the predetermined order; and downsampling each filtered value in the predetermined order.

A computer program product according to some embodiments includes at least one tangible computer-readable medium carrying program instructions executable to implement fractional delay recovery for a multichannel analog to digital converter, wherein the analog to digital converter includes a sample and hold circuit. In some embodiments, the instructions executable to implement upsampling each digital version of a plurality of analog signals in a predetermined order corresponding to an order of sampling and converting the analog input signals; digitally filtering each upsampled value in the predetermined order; and downsampling each filtered value in the predetermined order.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION OF EMBODIMENTS OF THE INVENTION

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

In various aspects of the disclosure, a method is disclosed wherein a multiplexed input arrangement may successfully be used in very high speed/high bandwidth applications, thereby providing the size and power reductions desired.

Figure 4:
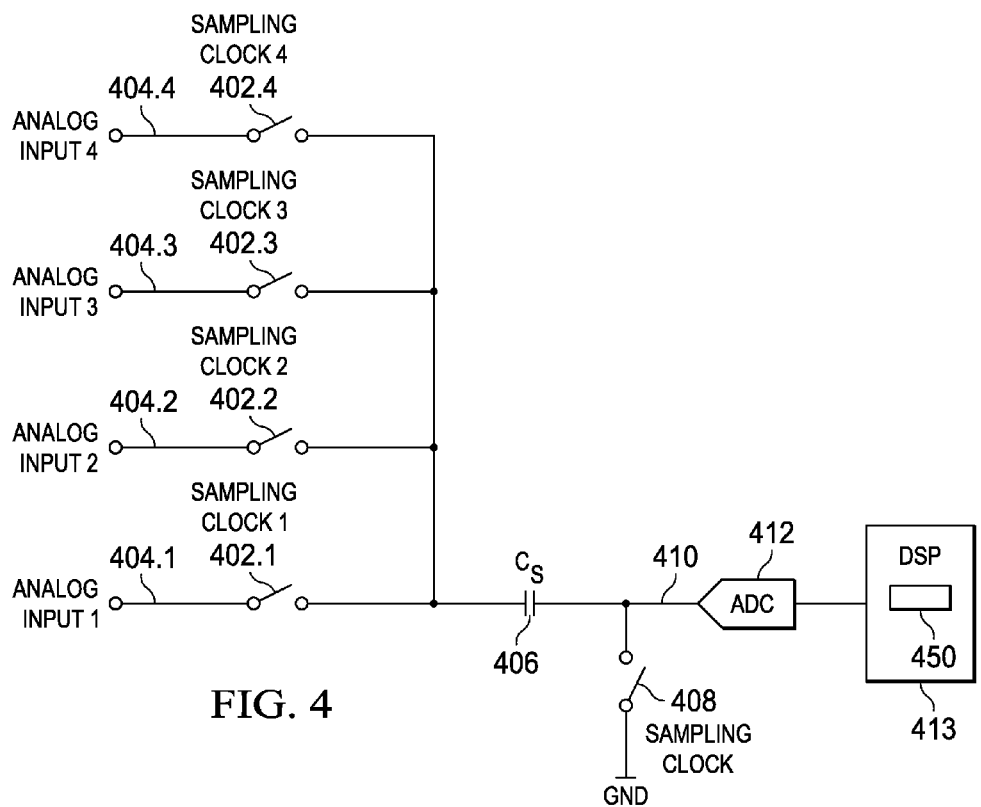
FIG. 4 is an exemplary multichannel ADC according to the inventive concept.

Turning now to FIG. 4, an exemplary system implementing embodiments as claimed is illustrated. In particular, according to the inventive concept of the disclosure, a single ADC 412 converts multiple analog inputs 404n. A plurality of inputs 404n are multiplexed in time and sampled by the ADC 412 one at a time, in a predetermined order, and each sample is converted to a digital version of the signal. Thus, the system includes sampling clocks 402n, capacitor 406, and sample clock 408.

Figure 5:
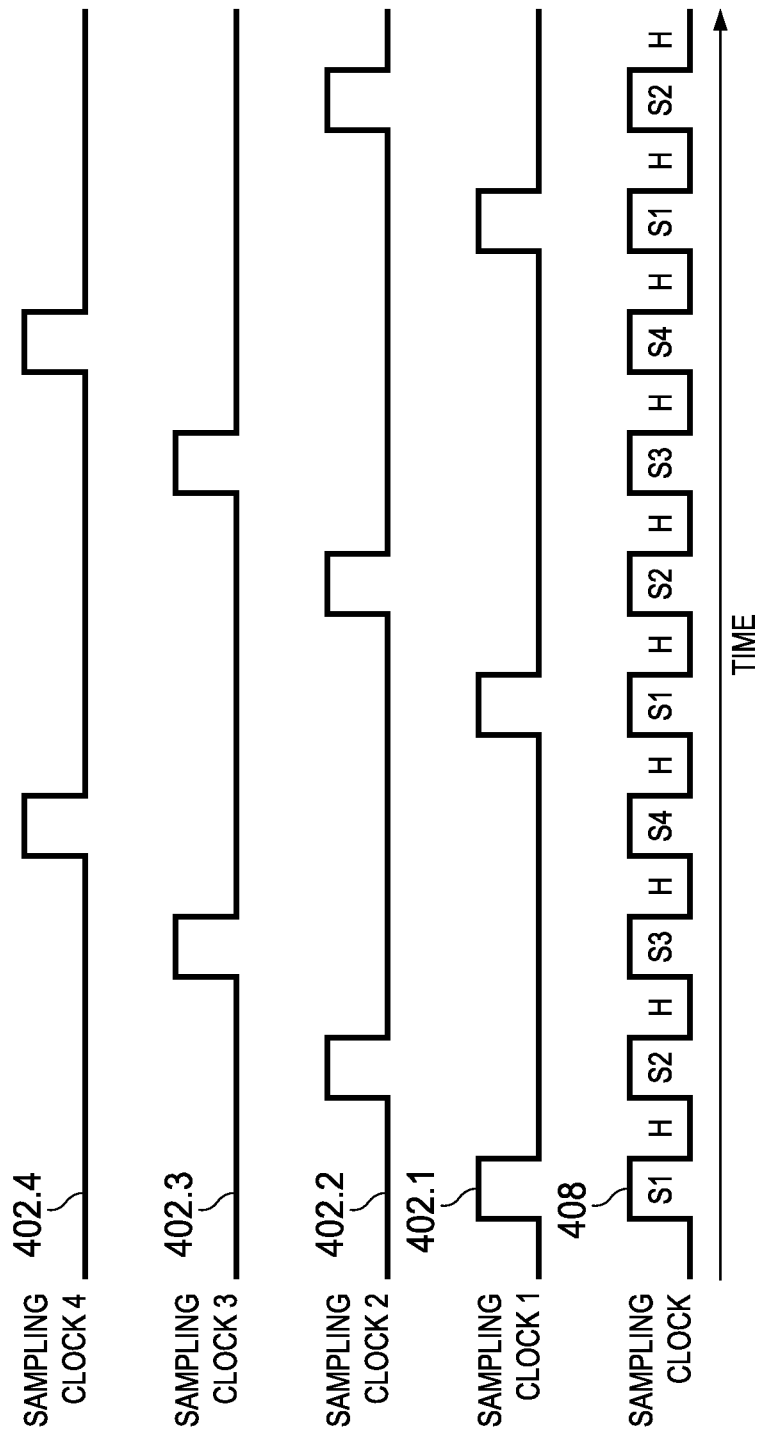
FIG. 5 is an exemplary drive signal scheme according to the inventive concept, associated with the ADC of FIG. 4.

The example shows four inputs, but clearly any number of inputs may be converted, providing the bandwidth (conversion time) of the ADC 412 is sufficient to convert all signals in the sampling period. In the example shown (and as illustrated in the timing diagram of FIG. 5), the four inputs are sampled in the order 1-2-3-4-1-2-3-4-1-2 . . . . As a result, the digital output data stream contains all the four inputs organized in the same time-interleaved order: 1-2-3-4-1-2-3-4-1-2- . . . . In the various embodiments a digital time-demultiplexer may be used to determine data associated with each channel. The output of the ADC 412 may be provided to the DSP 413 for processing 450 in accordance with embodiments of the invention.

The order of the inputs of the ADC can be permuted in any desired way by means of a simple programmable digital state machine. For example, it is possible to sample the inputs in the time-interleaved order 4,3,2,1,4,3,2,1, . . . . Similarly, any number of the inputs fewer than all the inputs can be sampled in any desired time-interleaved order by means of a programmable digital state machine. For example, the three inputs 1, 3, and 4 can be selected to be sampled in the time-interleaved order 1,4,3,1,4,3, . . . .

Figure 1:
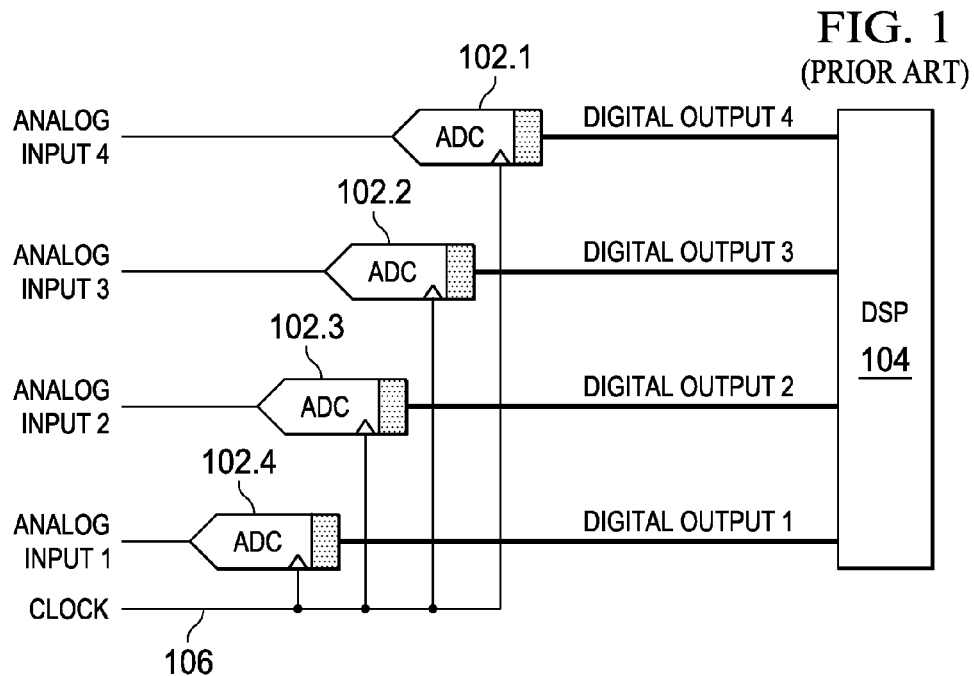
FIG. 1 is a typical multichannel ADC circuit with a plurality of ADC circuits according to the prior art.
Figure 2:
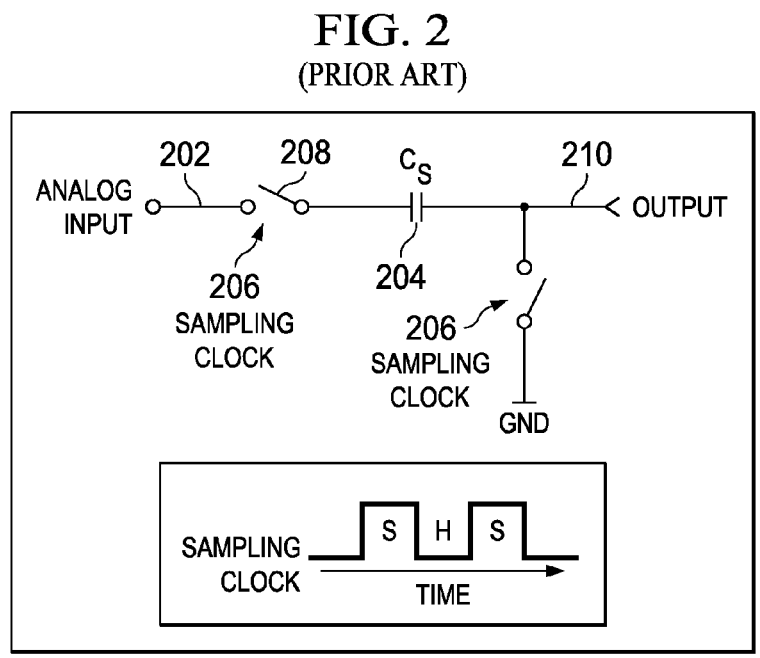
FIG. 2 is a typical sample and hold circuit according to the prior art.
Figure 3:
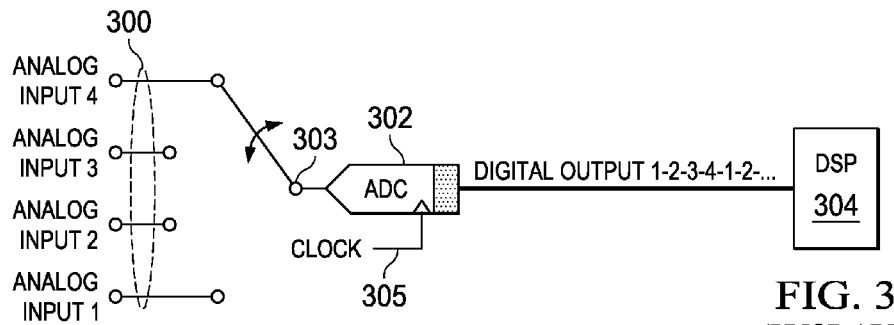
FIG. 3 is a typical sample and hold circuit electrically connected to an ADC according to the prior art.

In comparison with the prior art solution FIG. 1, the use of a single ADC 412 as in FIG. 4 offers certain advantages, including diminished channel mismatch, because all the inputs are converted by the same ADC 412; fewer problems related to unbalanced clock distribution; reduced area and power consumption; and improved test yield of the system.

However, the different inputs 404n are sampled with some time delay with respect to each other. In a system wherein synchronous sampling of the inputs is required, this problem must be addressed. The delay between samples of different inputs is deterministic, and not random as in the case of multiple ADCs (FIG. 1), therefore may be compensated per the inventive concept discussed hereinafter. Embodiments of the invention thus implement a fractional delay recovery 450, as discussed below.

Figure 6:
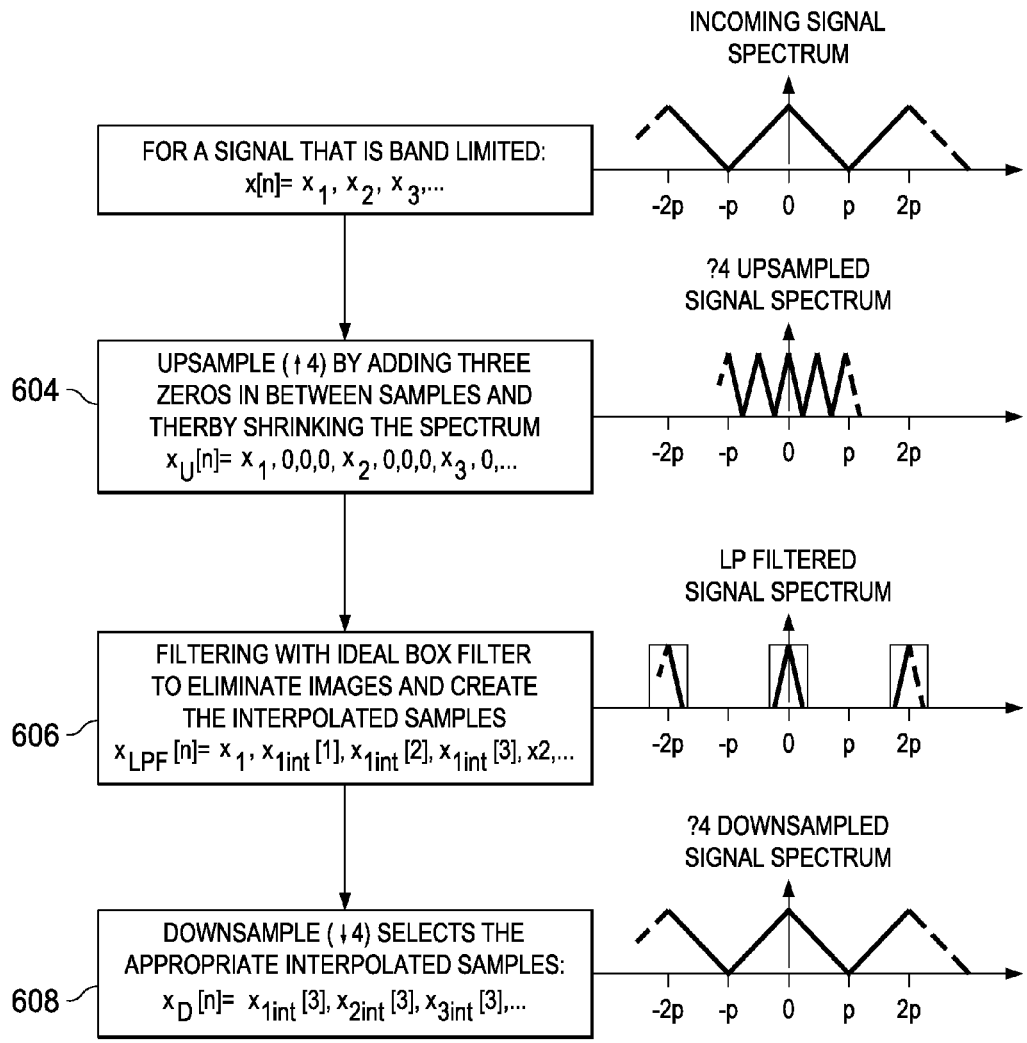
FIG. 6 is a flow chart of a method according to the inventive concept of the disclosure.

Referring to FIG. 6, delay of a sampling instant of an analog input k (where k=1, . . . n), with respect to the sampling instant of the analog input 1 (404.1), is a fraction (k−1)/n of Ts, where Ts is the sampling period of each input 404n and n is the number of sampled inputs. To equalize the delay among the signals the signal coming from the input k is delayed by a fractional delay Ts where=(n−k+1)/n, for any k=1, . . . , n.

Fractional delays of digital signals are determined as a result of three digital operations: upsampling 604, low-pass filtering 606, and downsampling 608. Looking to FIG. 6, the upsampling operation 604 adds (n−1) zeros in between the signal samples x. This corresponds in a frequency domain to shrinking the spectrum by a factor of n. As a result, images of the signal will appear in the interval [−n,+n]. At step 606, low pass filtering is performed to remove the images of the up-sampled signal Xu. In various embodiments, a BOX filtering technique is used.

At the filter output the zeros of the incoming signal have been replaced with interpolated samples, and the signal XLPF has been entirely reconstructed at an n-times higher sampling rate. The down sampling operation 608 selects one every n samples from Xlpf. In the frequency domain, this corresponds to bringing the spectrum of XD back to the original shape of Xi, but according to the particular phase chosen in the down sampling operation, i.e., according to which interpolated sample is selected, a different fractional delay has been introduced in the signal.

While specific implementations and hardware/software configurations for the mobile computing device have been illustrated, it should be noted that other implementations and hardware configurations are possible and that no specific implementation or hardware/software configuration is needed. Thus, not all of the components illustrated may be needed for the device implementing the methods disclosed herein.

As used herein, whether in the above description or the following claims, the terms "comprising," "including," "carrying," "having," "containing," "involving," and the like are to be understood to be open-ended, that is, to mean including but not limited to. Only the transitional phrases "consisting of" and "consisting essentially of," respectively, shall be considered exclusionary transitional phrases, as set forth, with respect to claims, in the United States Patent Office Manual of Patent Examining Procedures.

Any use of ordinal terms such as "first," "second," "third," etc., in the claims to modify a claim element does not by itself connote any priority, precedence, or order of one claim element over another, or the temporal order in which acts of a method are performed. Rather, unless specifically stated otherwise, such ordinal terms are used merely as labels to distinguish one claim element having a certain name from another element having a same name (but for use of the ordinal term).

The above described embodiments are intended to illustrate the principles of the invention, but not to limit the scope of the invention. Various other embodiments and modifications to these preferred embodiments may be made by those skilled in the art without departing from the scope of the present invention.

What is claimed is:

1. A method for controlling a multichannel analog to digital converter, wherein the analog to digital converter includes a sample and hold circuit, comprising:
    sampling a plurality of analog channels each receiving an associated analog signals in a predetermined order;
    converting each analog signal associated with one of said analog channels to a digital version comprising digital samples of the analog signal in the predetermined order, wherein digital samples associated with one of the plurality of analog signals are time delayed with respect to digital samples of another one of the plurality of analog channels;
    upsampling each digital version in the predetermined order;
    digitally filtering each upsampled value in the predetermined order; and
    downsampling each filtered value in the predetermined order such that time delays between digital samples of different analog channels are removed.

2. The method of claim 1, wherein the number of the plurality of analog channels and associated analog signals is "n", and further wherein upsampling each digital version consists of inserting (n−1) zeroes between the digital versions.

3. The method of claim 1, wherein the digital filtering step is a BOX filter technique.

4. The method of claim 1, wherein the converting includes converting using a single analog-to-digital converter.

5. A computer program product including at least one tangible non-transitory computer-readable medium carrying program instructions executable to implement fractional delay recovery for a multichannel analog to digital converter, wherein the analog to digital converter includes a sample and hold circuit and wherein the analog to digital converter is controlled to sequentially sample a plurality of channels in a predetermined order and the fractional delay recovery removes delays between samples of digital versions of the analog signals of different channels.

6. A computer program product in accordance with claim 5, wherein the instructions are executable to implement:
    upsampling each digital version of a plurality of analog signals each analog signal being associated with one of said plurality of channels in the predetermined order corresponding to an order of sampling and converting the analog input signals;
    digitally filtering each upsampled value in the predetermined order; and
    downsampling each filtered value in the predetermined order such that time delays between the digital versions of the analog signals are removed.

7. The computer program product of claim 6, wherein the number of the plurality of analog signals is "n", and further wherein upsampling each digital version consists of inserting (n−1) zeroes between the digital versions.

8. The computer program product of claim 6, wherein the digital filtering is a BOX filter technique.

9. A system, comprising:
    a multiplexer receiving a plurality of analog signals and controlled to sequentially select one of said analog signals in a predetermined order;
    a sample-and-hold circuit for receiving of the analog input signal selected by said multiplexer;
    an analog-to-digital converter for converting each of the selected analog input signals to a corresponding digital signal; and
    a processor configured for implementing fractional delay recovery for the analog-to-digital converter such that time delays between digital samples of different analog signals are removed.

10. A system in accordance with claim 9, the fractional delay recovery including:
    converting each of the plurality of analog input signals to a digital version in the predetermined order;
    upsampling each digital version in the predetermined order;
    digitally filtering each upsampled value in the predetermined order; and
    downsampling each filtered value in the predetermined order.

11. The system of claim 9, wherein the number of the plurality of analog input signals is "n", and further wherein upsampling each digital version consists of inserting (n−1) zeroes between the digital versions.

12. The system of claim 9, wherein the digital filtering is a BOX filter technique.

* * * * *

UNITED STATES PATENT AND TRADEMARK OFFICE
CERTIFICATE OF CORRECTION

| | | |
|---|---|---|
| PATENT NO. | : 8,643,522 B2 | Page 1 of 1 |
| APPLICATION NO. | : 13/489714 | |
| DATED | : February 4, 2014 | |
| INVENTOR(S) | : Andrea Panigada et al. | |

It is certified that error appears in the above-identified patent and that said Letters Patent is hereby corrected as shown below:

In the Claims

Column 5,
Line 6 "...associated analog signals in a predetermined order;..."
Change to "...associated analog signal in a predetermined order;..."

Signed and Sealed this
Twenty-second Day of April, 2014

Michelle K. Lee
*Deputy Director of the United States Patent and Trademark Office*